United States Patent [19]
Umesato

[11] Patent Number: 5,475,568
[45] Date of Patent: Dec. 12, 1995

[54] POWER SUPPLY STRUCTURE FOR MULTICHIP PACKAGE

[75] Inventor: Shoji Umesato, Tokyo, Japan

[73] Assignee: NEC Corporation, Tokyo, Japan

[21] Appl. No.: 234,101

[22] Filed: Apr. 28, 1994

[30] Foreign Application Priority Data

Apr. 28, 1993 [JP] Japan .................................. 5-102069

[51] Int. Cl.$^6$ ...................................................... H05K 1/11
[52] U.S. Cl. .......................... 361/784; 361/775; 361/794; 439/65
[58] Field of Search ..................................... 361/784–785, 361/790–795, 803, 775; 174/260–261; 439/44, 50, 52–53, 65, 74

[56] References Cited

U.S. PATENT DOCUMENTS

| | | | |
|---|---|---|---|
| 4,628,411 | 12/1986 | Balderes et al. | 361/792 |
| 4,819,131 | 4/1989 | Watari | 361/792 |
| 4,958,258 | 9/1990 | Charruau | 361/784 |

*Primary Examiner*—Bot Ledynh
*Attorney, Agent, or Firm*—Sughrue, Mion, Zinn, Macpeak & Seas

[57] ABSTRACT

A power supply structure for a multichip package is provided to improve the transmission performance of signals. Cases are fitted onto one face of a ceramic substrate. On the other face are aligned substrates. On each of the substrates are erected I/O pins. The I/O pins are connected to signal pins of LSIs via the ceramic substrate's internal layer. On side faces of the substrates are provided power supply pads. To the power supply pads are connected the power supply pins of the LSIs via the ceramic substrate's internal layer. When power is to be supplied, electroconductive bars are inserted between the substrates. The electroconductive bars supply power to the LSIs via the power supply pads. A cable is connected to one of the I/O pins.

6 Claims, 5 Drawing Sheets

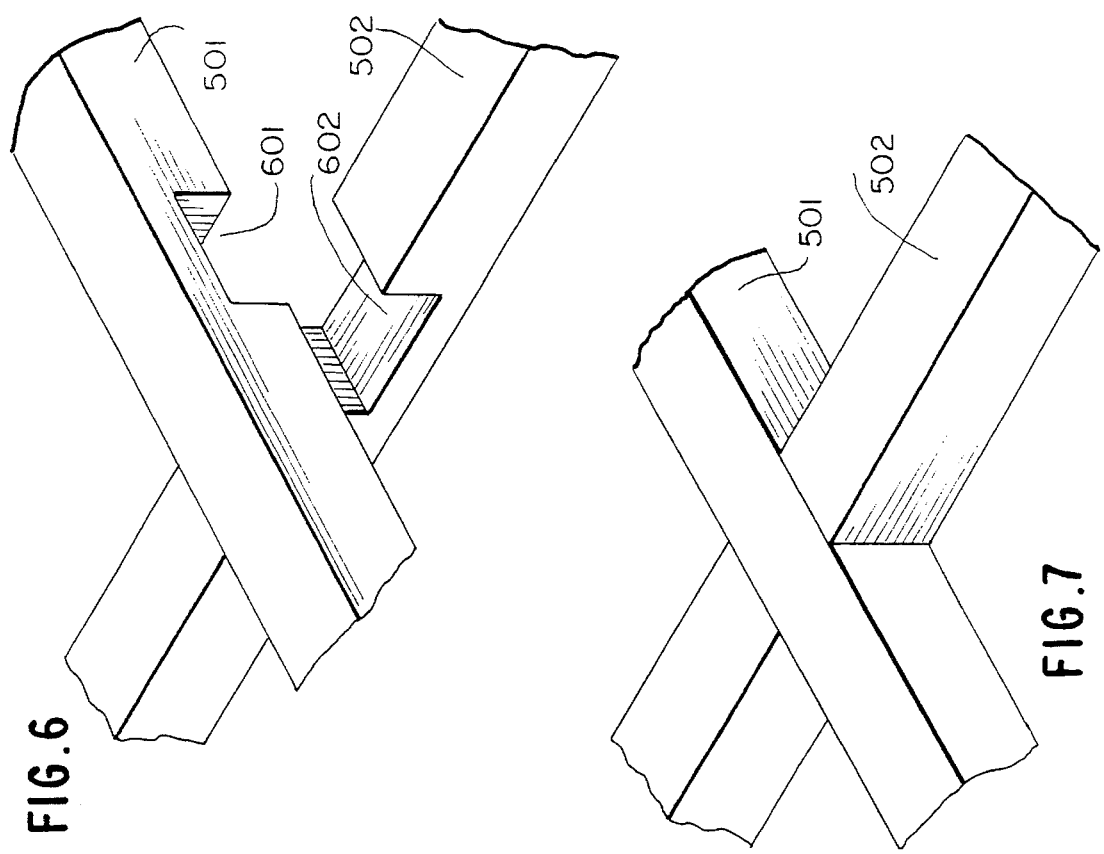
FIG. 6
FIG. 7
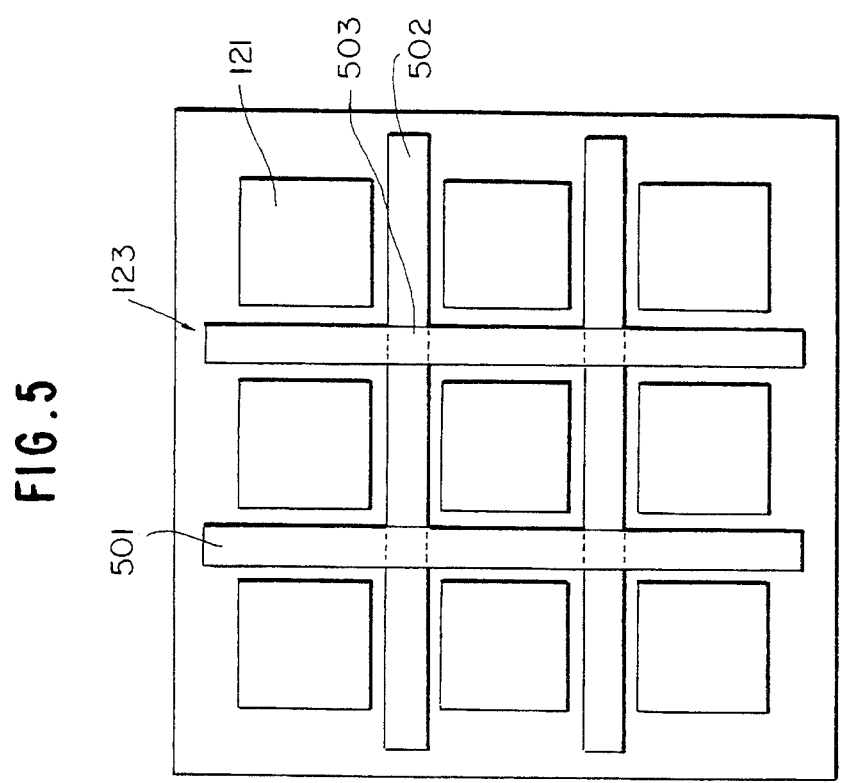
FIG. 5

POWER SUPPLY STRUCTURE FOR MULTICHIP PACKAGE

BACKGROUND OF THE INVENTION

The present invention relates to a power supply structure for a multichip package, and more particularly to a power supply structure for a multichip package in which high-speed integrated circuits are to be mounted.

Multiple packaging is one of the techniques for increasing the signal transmission speed between integrated circuits. Multichip packaging means the mounting of a plurality of integrated circuits on a single substrate. Within a multichip package, a plurality of integrated circuits are packaged in high density. The shorter distances between the integrated circuits result in the faster signal transmission between the circuits.

However, a further increase in processing speed of integrated circuits requires further improvement in signal transmission speed. A technique for satisfying this requirement, disclosed in the U.S. Pat. No. 4,819,131, is intended for further improvement in the signal transmission speed between integrated circuits.

Referring to FIG. 8, a plurality of integrated circuit chips 2 are packaged over a multilayer substrate 1. The integrated circuit chips 2 and the multilayer substrate 1 constitute a multichip package. Referring to FIG. 10, the multi-layer substrate 1 is mounted on a mother board 20. The multi-layer substrate 1 and the mother board 20 are connected to each other by input/output pins and power supply pins. Referring to FIG. 9, the input/output pins and the power supply pins constitute coaxial pins 3. Inner conductors 8 of the coaxial pins 3 are the input/output pins, which convey signals. Outer conductors 9 surpress waveform distortion or crosstalk of these signals. The elimination of waveform distortion or crosstalk result in the reduction of the distances between the input/output pins, which in turn serves to shorten the distances between the integrated circuit chips 2. Shorter distances between the integrated circuit chips 2 result in a higher speed of signal transmission.

The above-described technique achieve higher signal transmission speed within a multichip package. However, no effective technique has as yet been developed to increase the speed of signals transmission between the inside and the outside of a multichip package.

Referring again to FIGS. 8 and 10, on the rear face of the mother board 20 is provided a connector, not shown, to which an external unit is connected. Signals between the integrated circuit chips 2 and the external unit pass the connector on the rear face of the mother board 20, the mother board 20, the coaxial pins 3 and the multilayer substrate 1. The route which the signals pass is called the transmission path. The transmission path includes two kinds of connectors, i.e. the connector on the rear face of the mother board 20 and the coaxial pins 3.

If the transmission path is shortened, the speed of signal transmission between the integrated circuits and the external unit can be increased, and the distortion of signals can be improved by reducing the number of connectors included in the transmission path, because mismatching of impedances within the connector is one of the causes of signal distortion. Improvement of signal distortion can further increase the speed of signal transmission.

The requirements can be simultaneously satisfied by dispensing with the mother board 20, which is rather thick on account of the presence of power layers within. Therefore, by eliminating this mother board 20, the transmission path can be considerably shortened, and the number of connectors can also be reduced by one.

The main roles of the mother board 20 are to supply power to and to hold the multichip package. Therefore, in order to dispense with the mother board 20, some power supply structure to replace it should be developed. The power supply structure should also serve the purpose of holding the multichip package.

SUMMARY OF THE INVENTION

Therefore, an object of the present invention is to provide a power supply structure to replace the mother board 20 for the multichip package. This novel power supply structure should serve to hold the multichip package, shorten the transmission path and reduce the number of connectors involved in the transmission path.

In order to achieve this object, a power supply structure for a multichip package according to a first aspect of the invention includes a first substrate and integrated circuits mounted on a first face of this first substrate, said integrated circuits having signal pins and power supply pins; a plurality of second substrates aligned on a second face of said first substrate, said second substrates having wiring inside; power supply pads provided on side faces of said second substrates, said power supply pads being connected to said power supply pins of said integrated circuits via said first substrate; one bar inserted between each couple of said second substrates, said bar being at least partly electroconductive, said bar being electrically connected to said power supply pads when inserted between said second substrates, and said bar being supplied with power.

According to a second aspect of the invention, pins are provided on one face of each of said second substrates, and said pins are connected to said signal pins of said integrated circuits via said wiring of said second substrates and said first substrate.

According to a third aspect of the invention, said bar comprises a first conductor layer, a second conductor layer and an insulator layer provided between said first and second conductor layers.

According to a fourth aspect of the invention, said power supply structure for a multichip package has third, fourth and fifth substrates as said plurality of second substrates; and said power supply structure for a multichip package has first and second bars as said bars, of which said first bar is inserted between said third and fourth substrates, said second bar is inserted between said fourth and fifth substrates, and said first bar and said second bar are parallel to each other.

According to a fifth aspect of the invention, said power supply structure for a multichip package has third, fourth and fifth substrates as said plurality of second substrates; and said power supply structure for a multichip package has first and second bars as said bars, of which said first bar is inserted between said third and fourth substrates, said second bar is inserted between said fourth and fifth substrates, and said first bar and said second bar cross each other.

According to a sixth aspect of the invention, said first and second bars crossing each other are insulated from each other.

BRIEF DESCRIPTION OF THE DRAWINGS

Other objects, features and advantages of the present invention will become more apparent when the following detailed description is read in conjunction with the accompanying drawings, wherein:

FIG. 5 shows a cross section of the power supply structure for a multichip package, which is a third preferred embodiment of the invention;

FIG. 6 shows a magnified exploded view of the electroconductive bar 123 in FIG. 5; and FIG. 7 shows a magnified view of the electroconductive bar 123 in FIG. 5.

In the figures, the same reference numerals denote respectively the same parts.

DETAILED DESCRIPTION OF THE PREFERRED EMBODIMENTS (First Embodiment)

Next will be described in detail a first preferred embodiment of the present invention with reference to drawings.

Figure 1:
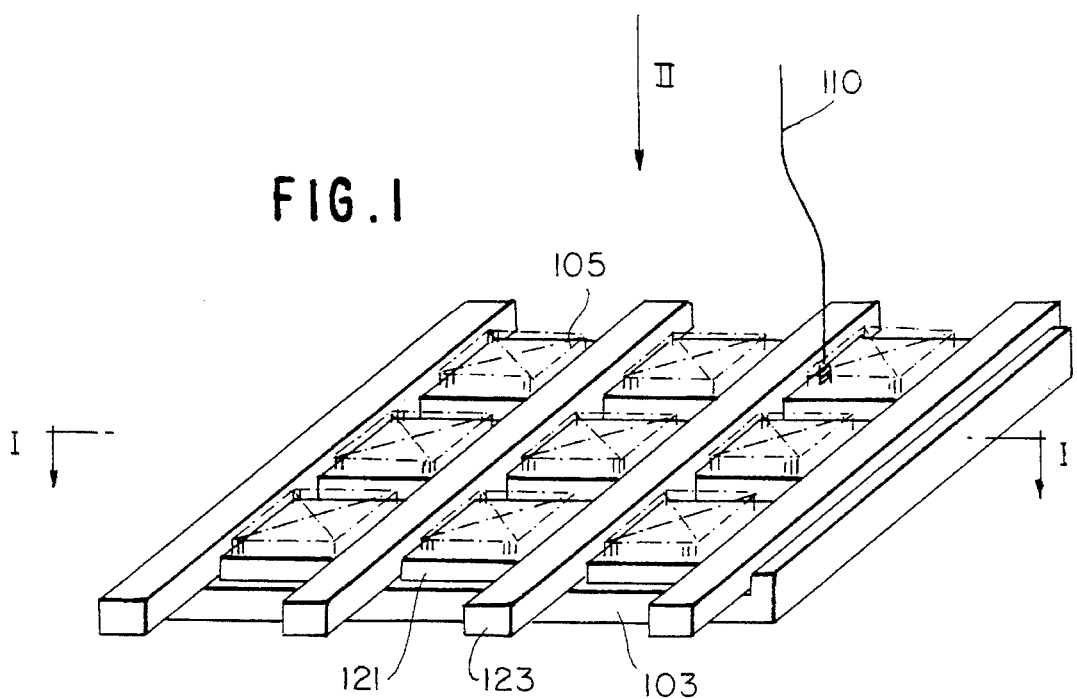
FIG. 1 shows a perspective view of the power supply structure for a multichip package, which is a first preferred embodiment of the invention.
Figure 2:
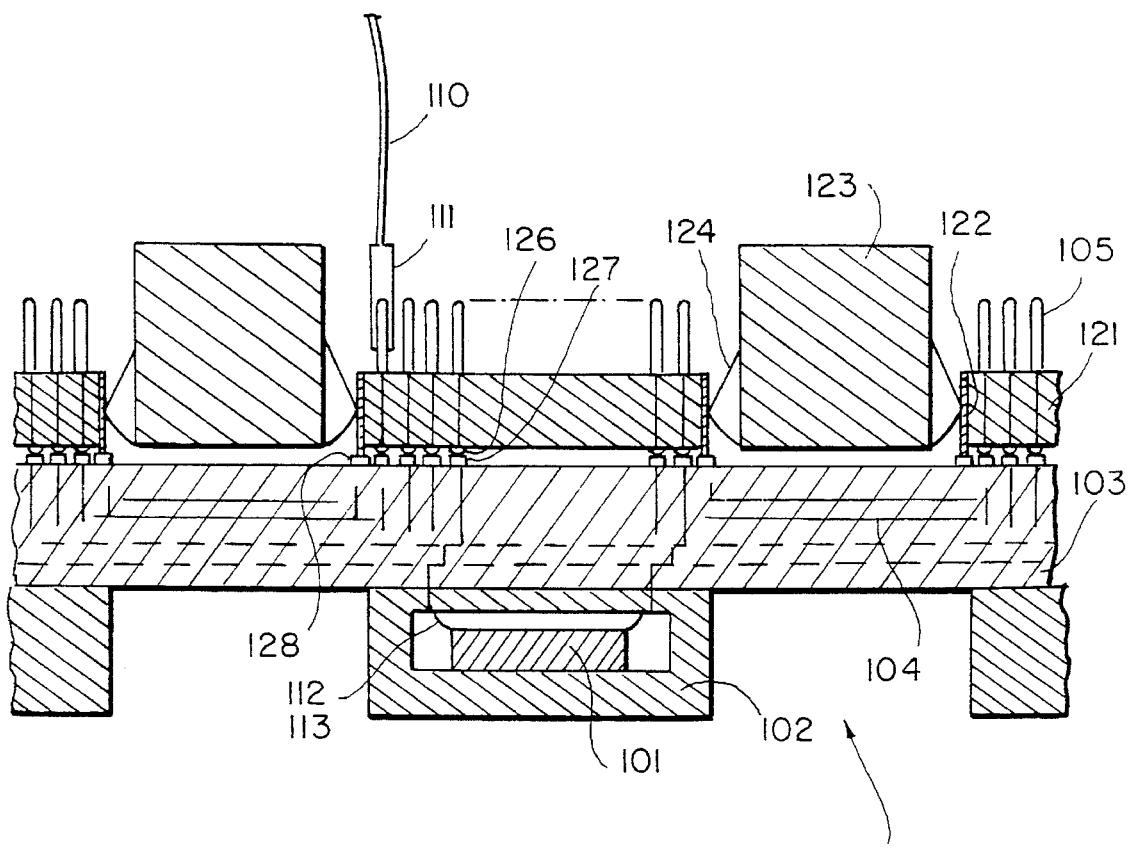
FIG. 2 shows a cross section of the structure illustrated in FIG. 1 with respect to line I—I.

Referring to FIG. 1, a plurality of substrates 121 are fitted in a matrix form over a ceramic substrate 103. Between the substrates 121 are inserted electroconductive bars 123. The substrates 121 and the electroconductive bars 123 constitute a novel power supply structure. Referring now to FIGS. 1 and 2, on one face of the ceramic substrate 103 are mounted a plurality of cases 102 in a matrix form. An LSI is housed within each of the cases 102. Power supply pins 112 and signal pins 113 of the LSI's 101 are connected via the cases 102 to an internal layer 104 of the ceramic substrate 103.

On the other face of the ceramic substrate 103 are provided substrates 121, each of which presents a rectangular solid form. Each of the substrate 121 is fitted in a position corresponding to one of the cases 102 on the rear face of the ceramic substrate 103. A plurality of I/O pins 105 are erected on the upper face of each substrate 121. I/O pins 105 are connected to a pad 126 on the rear face of the substrate 121 via internal wiring 125 of the substrate 121. The pads 126 are connected to the internal layer 104 of the ceramic substrate 103 via pads 127 of the ceramic substrate 103. The internal layer 104 of the ceramic substrate 103 is connected to the signal pins 113 of the LSI's 101. Thus, the I/O pins 105 are indirectly connected to the signal pins 113 of the LSI's 101.

A cable 110 has a connector 111 at its tip. The connector 111 is connected to an I/O pin 105. The cable 110 connects the I/O pin 105 to an external unit.

On two side faces of each substrate 121 are provided power supply pads 122, which are plate-shaped electroconductive members. Each of the power supply pads 122 is connected to the internal layer 104 of the ceramic substrate 103 via a power supply pad 128 of the ceramic substrate 103. The internal layer 104 of the ceramic substrate 103 is connected to the power supply pins 112 of the LSI's 101. Thus, the power supply pads 122 are indirectly connected to the power supply pins 112 of the LSI's 101. The power supply pads 122 provided on the two side faces of the substrate 121 supply power from a different source to the LSI's 101.

No wiring layer is provided within the substrate 121. For the reason the substrates 121 are thinner than a mother board which would supply power, because a plurality of power wiring layers would be provided within the mother board for power supply.

Electroconductive bars 123 are conductive rods having a rectangular cross section. On two side faces of each electroconductive bar 123 are provided a pair of contacts 124, which are flexible electroconductive members. The electroconductive bars 123 are connected to a power source or sources not shown. It is possible to supply different voltages to different electroconductive bars 123.

Figure 3:
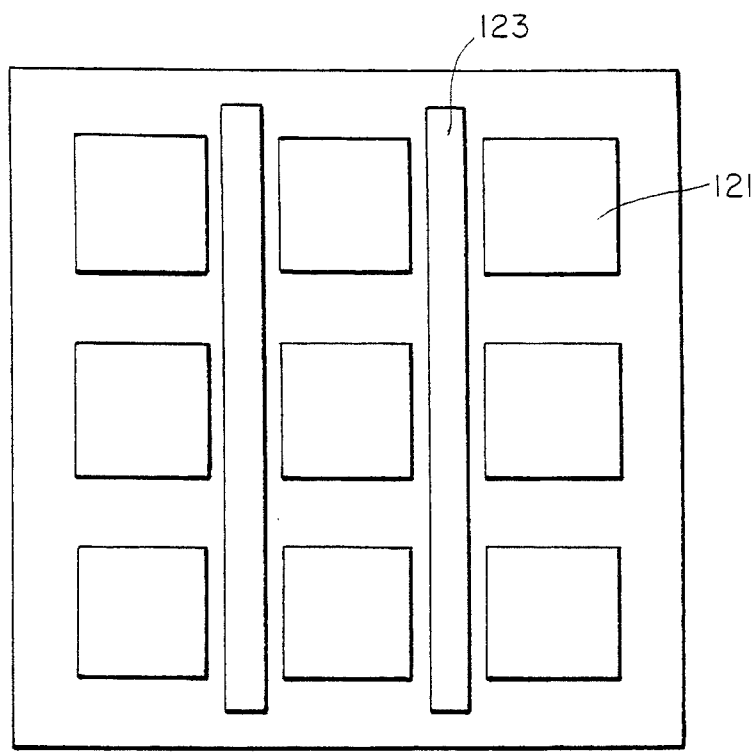
FIG. 3 shows a front view of the structure illustrated in FIG. 1 in direction II.

Referring now to FIGS. 1 and 3, the electroconductive bars 123 are arranged in parallel at equal intervals within the same plane, and fixed to a structure not shown. The intervals between the electroconductive bars 123 are equal to those between the cases 102.

Next will be described a case in which the electroconductive bars 123 and the cable 110 are to be connected to the ceramic substrate 103.

Referring to FIG. 2, the connection between the ceramic substrate 103 and the electroconductive bars 123 is accomplished in the following procedure. The substrate 121 mounting face of the ceramic substrate 103 is positioned opposite to the electroconductive bars 123. At this time, the position of the ceramic substrate 103 is so adjusted that each of the electroconductive bars 123 is opposite to the prescribed one of gaps between the substrate 121. After completion of this positional adjustment, the ceramic substrate 103 is pressed against the electroconductive bars 123. Each electroconductive bars 123 is inserted into the prescribed one of the gaps between the substrates 121. The contacts 124 of each electroconductive bars 123 come into contact with the power supply pads 122 of the adjoining substrates 121. The electroconductive bars 123 and a multichip package 100 are electrically connected to each other. At the same time, the multichip package 100 is held by the electroconductive bars 123.

After the connection of the electroconductive bars 123, the cable 110 is connected by inserting one of the I/O pins 105 into a connector 111. As the I/O pin 105 projects farther than the adjoining electroconductive bar 123, it can be readily inserted into the connector 111.

After completion of the connecting procedure, the multichip package 100 is held by the electroconductive bars 123. As the plurality of electroconductive bars 123 are placed in parallel to one another, they hold the multichip package 100 stably. If the surface of the ceramic substrate 103 is insulated, the lower face of each electroconductive bar 123 can be kept in contact withe the ceramic substrate 103, and this would further increase the stability of and the heat discharging from the multichip package 100.

By supplying power to each electroconductive bar 123, power can be supplied to the multichip package 100. The power supplied to the electroconductive bars 123 is supplied to the power supply pins 112 of the LSI's 101 via the electroconductive bars 123, contacts 124, power supply pads 122, power supply pads 128, ceramic substrate's internal layer 104, and the cases 102.

As described above, this embodiment presents a novel power supply structure consisting of the electroconductive bars 123 and the substrates 121. This power supply structure has equivalent functions to a mother board both in power supply and support. Accordingly, application of this power supply structure could dispense with a mother board. Because the substrates 121 are thinner than a mother board, the transmission path is shortened and, accordingly, the signal propagation speed is increased. Moreover, the number of connectors needed on the transmission path is reduced to one, resulting in suppressed distortion of signal waveforms.

Furthermore, this embodiment can stably supply power in a large capacity, because the areas of contact between the contacts 124 and the power supply pads 122 are large.

Besides that, this embodiment can prevent voltage deviation, which is a phenomenon that a difference in power supply voltage occurs between the central and peripheral parts of the ceramic substrate 103. The voltage deviation would result from the supply of power from the periphery of the ceramic substrate 103, but is eliminated in this embodiment because the electroconductive bars 123 supply power in the vicinities of the respective LSI's 101.

(Second Embodiment)

Next will be described a second preferred embodiment of the present invention.

This embodiment is characterized by the configuration of the electroconductive bars 123, each of which consist of an insulator layer 401, a conductor layer 402 and another conductor layer 403. In all other respects of configuration, the structure of this embodiment is the same as that of the first embodiment.

Figure 4:
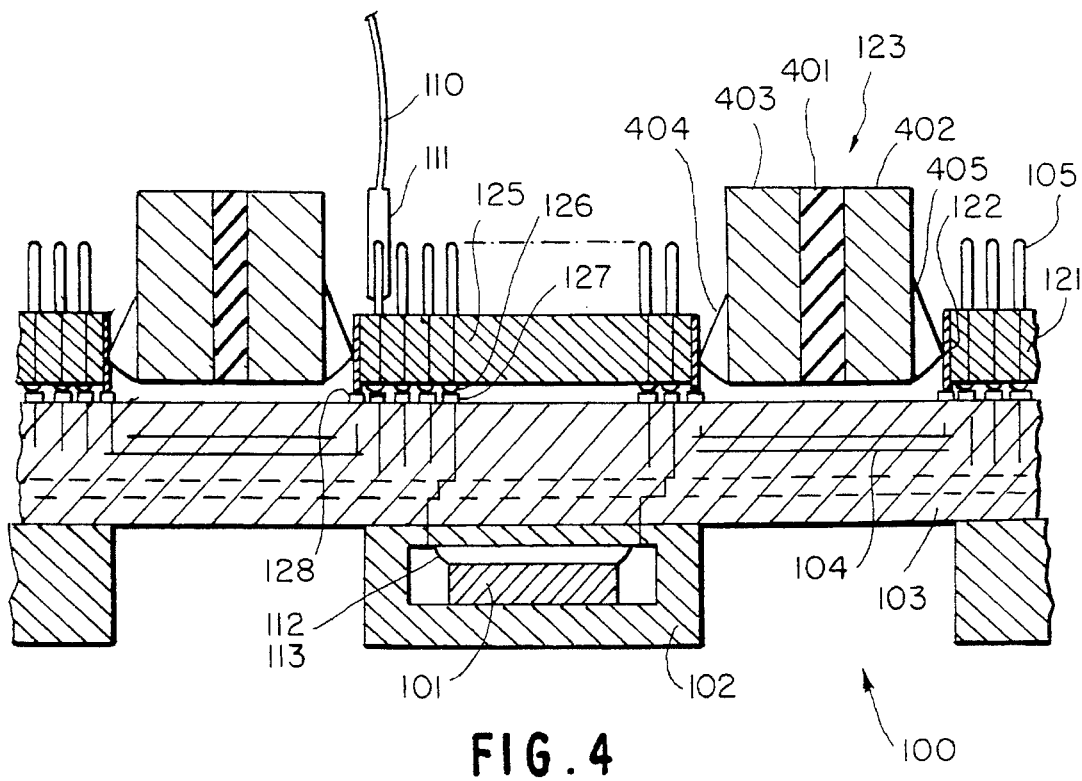
FIG. 4 shows a cross section of the power supply structure for a multichip package, which is a second preferred embodiment of the invention.
Figure 8:
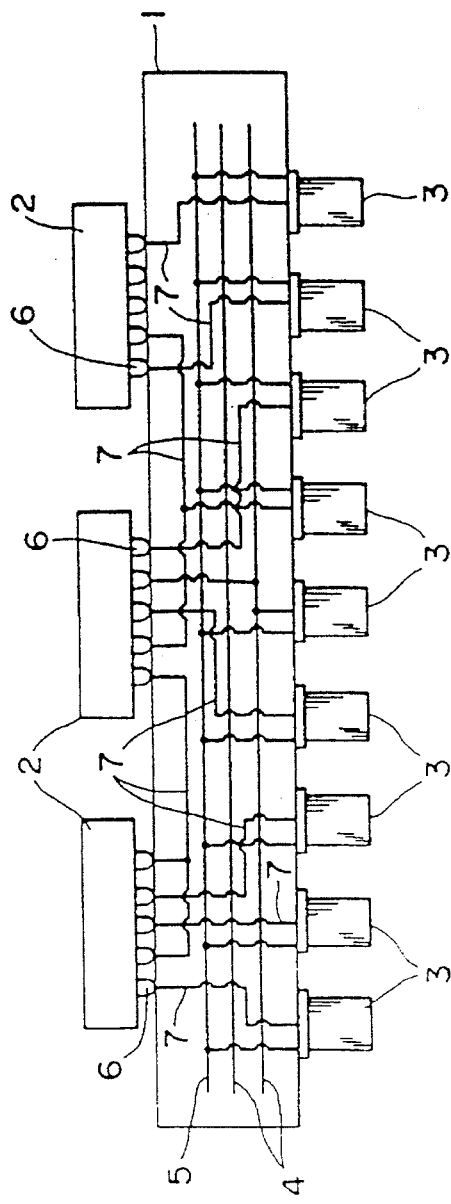
FIG. 8 shows a side view of an integrated circuit package according to the prior art.
Figure 9:
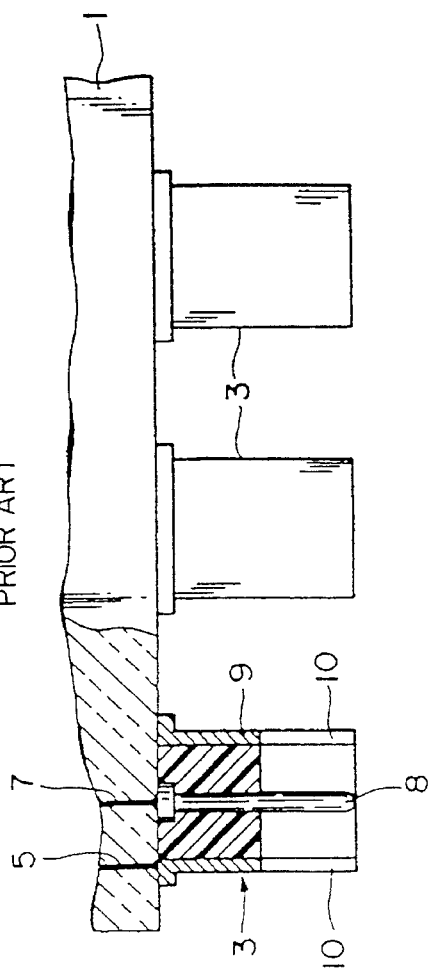
FIG. 9 shows an enlarged view partly, in section of the pins of FIG. 8.
Figure 10:
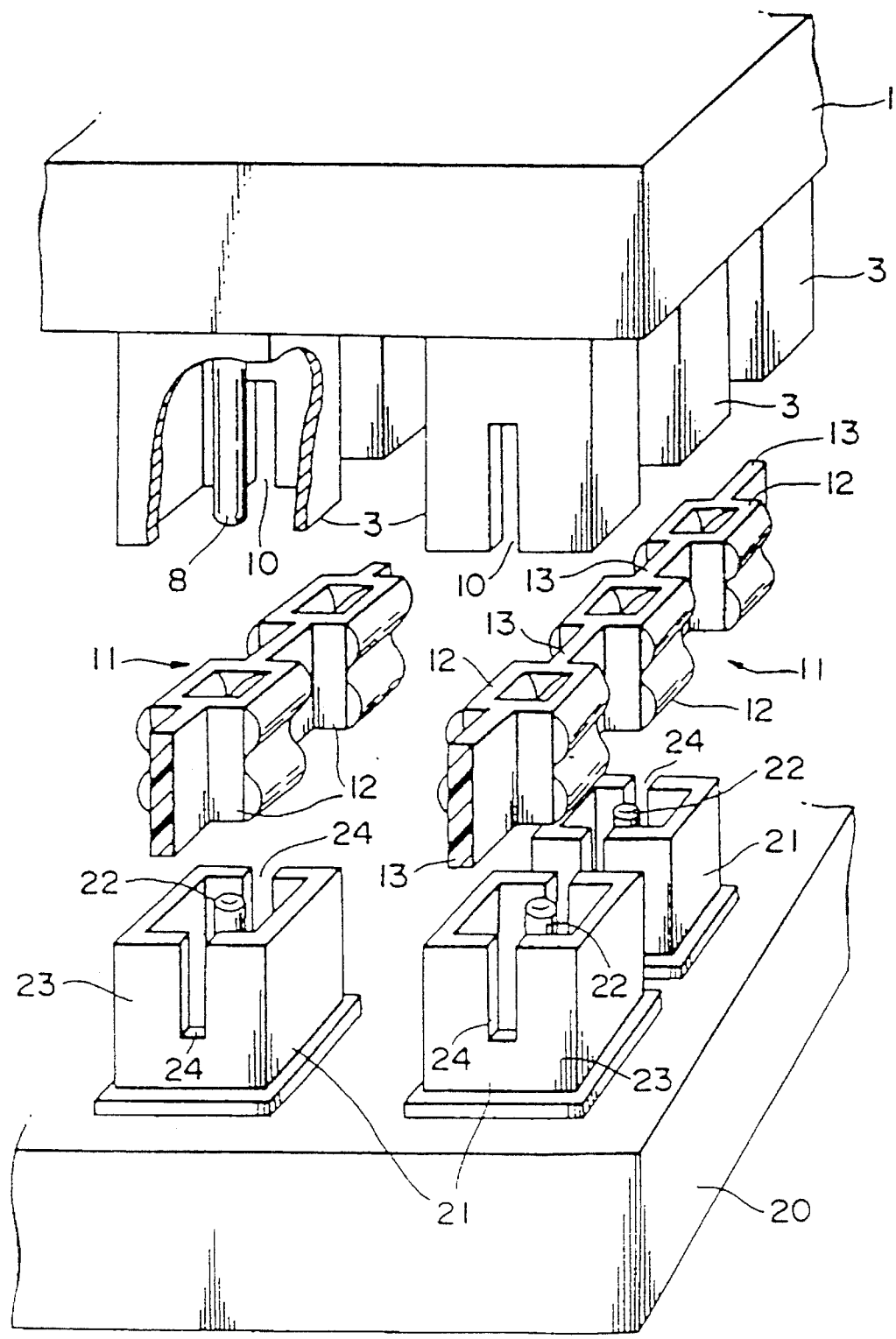
FIG. 10 shows a perspective view of the integrated circuit package, according to the prior art, with associated pin connectors and a mother board.

Referring to FIG. 4 illustrating the second preferred embodiment of the invention, each electroconductive bar 123 consists of the insulator layer 401, the conductor layer 402 and the other conductor layer 403. The insulator layer 401 is arranged between the conductor layer 402 and the other conductor layer 403. The insulator layer 401, the conductor layer 402 and the other conductor layer 403 are formed in an integrated manner to constitute a single road. On the side faces of the conductor layers 401 and 402 are provided contacts 404 and 405, respectively.

When connected, the contacts 404 and 405 are in contact with the power supply pads 122 of the respectively adjoining substrates 121. Power supply means, not shown, supplies different kinds of power to the conductor layers 403 and 404.

In this embodiment, each electroconductive bar 123 consists of the insulator layer 401, the conductor layer 402 and the other conductor layer 403. This configuration enables a single electroconductive bar 123 to supply two different kinds of power. In other words, this embodiment can supply twice as many kinds of power as the first embodiment.

(Third Embodiment)

Next will be described a third preferred embodiment of the present invention.

This embodiment is characterized by the arrangement of the electroconductive bars 123 in a grid form with the result that four side faces of each substrate 121 are provided with power supply pads 122. In all other respects of configuration, the structure of this embodiment is the same as that of the first embodiment.

Referring to FIG. 5 illustrating the third preferred embodiment of the invention, the electroconductive bars 123 consist of electroconductive bars 501, arranged in the vertical direction of the drawing, and electroconductive bars 502, arranged in the lateral direction of the drawing. The electroconductive bars 501 and 502 are arranged in a grid form.

Now will be described the structure of electroconductive bars 501 and 502. The electroconductive bars 501 and 502 cross each other at intersections 503.

Referring to FIG. 6, at each of these intersections 503, indents 601 and 602 are formed into the electroconductive bars 501 and 502, respectively.

Referring to FIG. 7, when the grid is to be assembled, the electroconductive bars 501 and 502 are fitted to each other, but are prevented from coming into electrical contact by the indents 601 and 602. The crossing sections of the electroconductive bars 123 can as well be insulated, thereby to further ensure the insulation between the electroconductive bars 501 and 502.

Power supply pads 121 are provided on all the four side faces of each substrate 121. The power supply pads 122 are structured in the same way as those of the first embodiment.

When connected, the substrates 121 are inserted into the openings of the electroconductive bars 123. At this time, the four contacts 124 of the electroconductive bars surrounding each substrate 121 come into contact with the power supply pads 122 on the respectively matching faces of the substrate 121.

When power is to be supplied, a prescribed power source is connected to each electroconductive bar. The connected power is supplied to the multichip package 100 via the electroconductive bars 123, the contacts 124 and the power supply pads 122. It is possible to supply different voltages to different electroconductive bars because they are insulated from one another.

In the embodiment, the first and second electroconductive bars 501 and 502 are structured into a grid form, and accordingly the multichip package 100 is held more stably. The number of electroconductive bars in this embodiment is greater, and accordingly more power can be supplied, than in the first embodiment. Furthermore, since the electroconductive bars are insulated from one another, a greater variety of power can be supplied than in the first embodiment. Electroconductive bars can as well be connected at prescribed intersections.

The essence of the present invention consists in the supply of power by the power supply pads 128 on the side faces of the substrates 121 and by the electroconductive bars 123 inserted between the substrates 121. Therefore, there is no limitation to the way in which the substrates 121 are to be arranged only if they come into contact with the electroconductive bars 123. Nor is there any limitation to the shape of the electroconductive bars 123 only if they come into contact with the power supply pads 128.

As this invention may be embodied in several forms without departing from the spirit of essential characteristics thereof, the above-described embodiments are therefore illustrative but not restrictive, since the scope of the invention is defined by the appended claims rather than by the description preceding them, and all changes that fall within the bounds of the claims, or any equivalence of such bounds, are therefore intended to be embraced by the claims.

What is claimed is:

1. A power supply structure for a multichip package comprising:

a first substrate;

integrated circuits mounted on a first face of this first substrate, said integrated circuits having signal pins and power supply pins;

a plurality of second substrates aligned on a second face of said first substrate;

power supply pads provided on side faces of said second substrates, said power supply pads being connected to said power supply pins of said integrated circuits via said first substrate; and a bar inserted between each couple of said second substrates, said bar being at least partly electroconductive, said bar being electrically connected to said power supply pads when inserted between said second substrates, and said bar being supplied with power.

2. A power supply structure for a multichip package, as claimed in claim 1, further comprising:

wiring provided within said second substrates, and pins provided on one face of each of said second substrates, said pins being connected to said signal pins of said integrated circuits via said wiring of said second substrates and said first substrate.

3. A power supply structure for a multichip package, as claimed in claim 1, wherein:

said power supply structure for a multichip package has third, fourth and fifth substrates as said plurality of second substrates;

said power supply structure for a multichip package has first and second bars as said bar, said first bar is inserted between said third and fourth substrates, said second bar is inserted between said fourth and fifth substrates, and said first bar and said second bar are parallel to each other.

4. A power supply structure for a multichip package, as claimed in claim 1, wherein:

said bar comprises a first conductor layer, a second conductor layer and an insulator layer provided between said first and second conductor layers.

5. A power supply structure for a multichip package, as claimed in claim 1, wherein:

said power supply structure for a multichip package has third, fourth and fifth substrates as said plurality of second substrates;

said power supply structure for a multichip package has first and second bars as said bar, said first bar is inserted between said third and fourth substrates, said second bar is inserted between said fourth and fifth substrates, and said first bar and said second bar cross each other.

6. A power supply structure for a multichip package, as claimed in claim 5, wherein:

said first and second bars crossing each other are insulated from each other.

* * * * *